United States Patent [19]
Tsuruta et al.

[11] Patent Number: 5,886,377
[45] Date of Patent: Mar. 23, 1999

[54] SEMICONDUCTOR DEVICE AND A METHOD FOR MANUFACTURING THEREOF

[75] Inventors: Masataka Tsuruta; Noriyuki Shimoji; Takuya Yonezawa, all of Kyoto, Japan

[73] Assignee: Rohm Co., Ltd., Kyoto, Japan

[21] Appl. No.: 812,539

[22] Filed: Mar. 7, 1997

[30] Foreign Application Priority Data

Mar. 7, 1996 [JP] Japan .................................... 8-050406

[51] Int. Cl.$^6$ .................................................. H01L 29/788
[52] U.S. Cl. ............................................................. 257/315
[58] Field of Search ............................................. 255/315

[56] References Cited

U.S. PATENT DOCUMENTS 5,557,123  9/1996  Ohta .
5,587,603  12/1996  Kowshik .
5,633,520  5/1997  Wu et al. .

*Primary Examiner*—Stephen D. Meier
*Attorney, Agent, or Firm*—Merchant, Gould, Smith, Edell, Welter & Schmidt

[57] ABSTRACT

An ONO layer 18 located vicinity of a transistor TR1 for programming is removed. A floating gate FG1 of the transistor TR1 is formed by carrying out etching of a polysilicon layer 16. Then, an inter-layer film SM1 of the transistor TR1 is formed by carrying out oxidation process. The inter-layer film SM1 is formed so as to cover the floating gate FG1. Arsenic is implanted ionically into a semiconductor-substrate 12 using the floating gate FG1 and the inter-layer film SM1 as a mask. Ions of the arsenic thus implanted do not pass through the inter-layer film SM1 and are stopped at the surface. Because the inter-layer film SM1 is made of a silicon oxidation layer formed relatively thick. So that, the inter-layer film SM1 maintains its charge-storage characteristic originally owns even when the ion implantation is carried out.

14 Claims, 8 Drawing Sheets

TR1 (section P1—P1)   TR2 (section P2—P2)

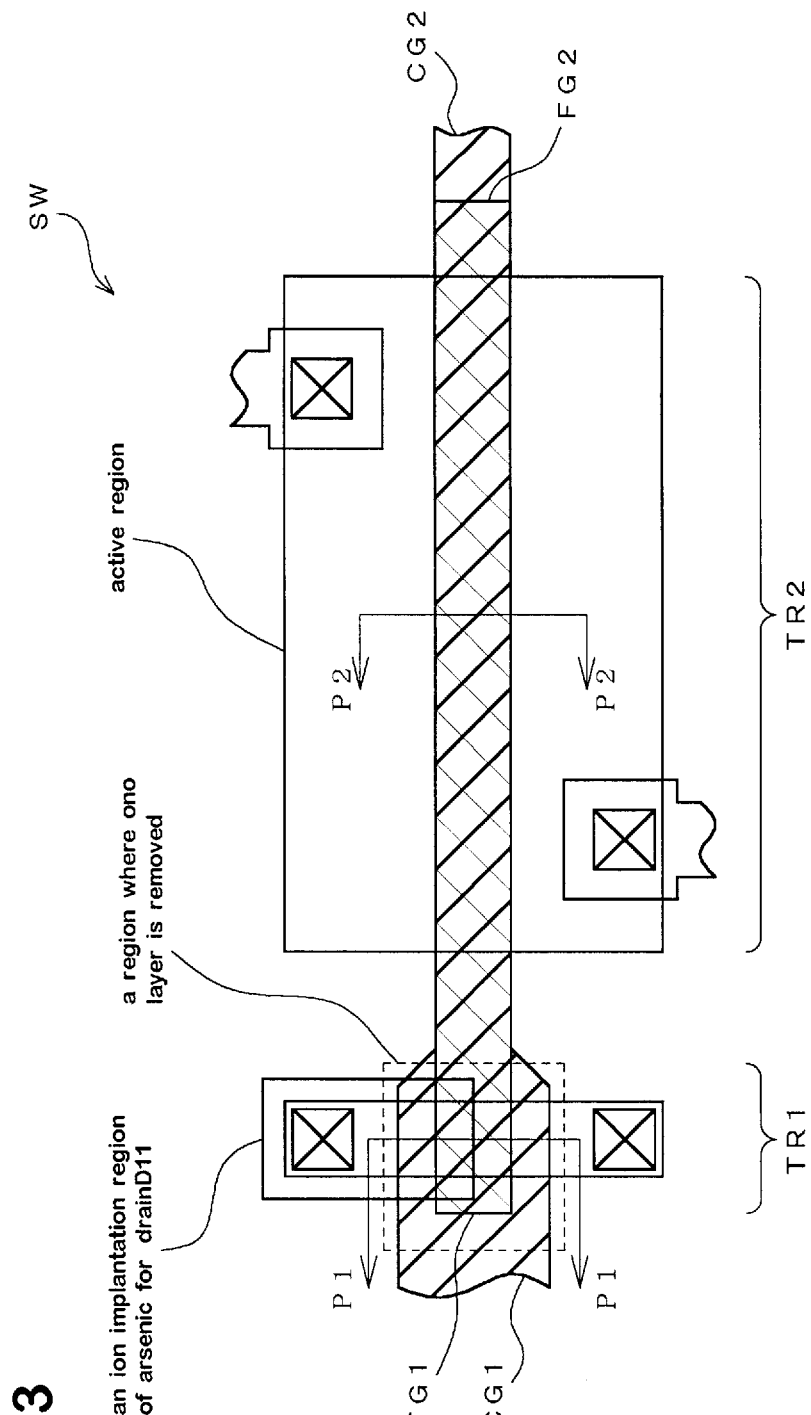

TR1 (section P1—P1)

TR1(section P1—P1)

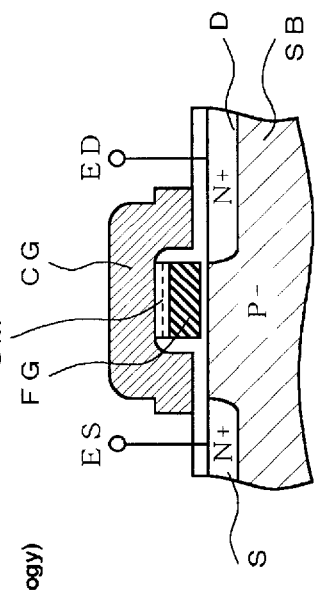
FIG.6B (Earlier Technology)
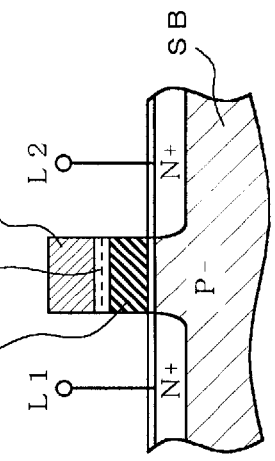
FIG.6C (Earlier Technology)
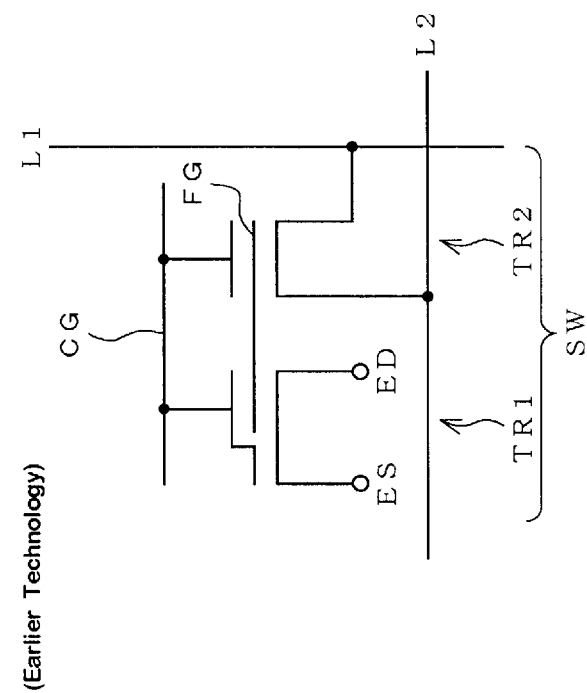
FIG.6A (Earlier Technology)

(Earlier Technology)

(Earlier Technology)

(Earlier Technology)

(Earlier Technology)

SEMICONDUCTOR DEVICE AND A METHOD FOR MANUFACTURING THEREOF

CROSS-REFERENCE TO RELATED APPLICATIONS

The entire disclosure of Japanese Patent Application No. Hei 8-50406 filed on Mar. 7, 1996 including specification, claims, drawings and summary are incorporated herein by reference in its entirely.

BACKGROUND OF INVENTION

1. Field of the Invention

This invention relates to a semiconductor device, more specifically a semiconductor device comprises two elements each of which having capacitor connected in parallel with each other and a method for manufacturing thereof.

2. Description of the Related Art

A programmable logic device (hereinafter referred to as PLD) is known as an large scale integrated circuit (hereinafter referred to as LSI) capable of programming logic functions by the user(s). The PLD is constructed so as to provide a number of logic circuits ready-to-operate on the chip for the LSI, and the logic circuits are connected one another through switches capable of programming. A switching element SW shown in FIG. 6A is considered as one of the switches for the PLD.

The switching element SW is constructed by connecting both of a transistor TR1 for programming and a transistor TR2 for switching with each other as shown in FIG. 6A. The transistor TR1 for programming is a split gate type electrically programmable read only memory (EPROM). Also, floating gates FG of the transistor TR1 for programming and the transistor TR2 for switching are formed continuously in common with each other. Control gates CG of both the transistor TR1 and the transistor TR2 are formed continuously in common with each other.

Either of information ON or OFF is written in the transistor TR1 by applying appropriate voltages to a terminal ES, a terminal ED, the control gate CG and a semiconductor substrate SB. The transistor TR2 connects or disconnects a wiring L1 and a wiring L2 in accordance with the information written in the transistor TR1.

FIG. 6B and FIG. 6C are sectional views showing structures of the transistor TR1 for programming and the transistor Tr2 for switching respectively. In order to write information OFF into the transistor TR1, a voltage which makes the floating gate FG in high potential is applied between the semiconductor substrate SB of the transistor TR1 and floating gate FG1. So that, electrons emitted from a source are attracted and trapped into the floating gate FG. Therefore, writing information is getting easier in proportion to make the floating gate in higher potential compared with the potential of the semiconductor substrate SB.

FIG. 7 shows an equivalent circuit of the transistor TR1 and the transistor TR2 in assumption of the switching element SW as connection of a plurality of capacitor. A voltage VL generated between the floating gate FG and the semiconductor substrate SB is calculated by an equation shown in FIG. 7, in case of a capacitance accumulated between the control gate CG and the floating gate FG is shown as C1U, C2U, a capacitance accumulated between the control gate CG and the semiconductor substrate SB is shown as C1L, C2L, and a voltage generated between the control gate CG and the semiconductor substrate SB is shown as V.

In other words, both the capacitance C1U and C2U should be increased in order to make the voltage VL in large value. To do that, it is preferable to use an ONO layer (a layer having triple layered structure such as silicon oxide layer-silicon nitride layer-silicon oxide layer) having a high charge-storage characteristic as an inter-layer film SM located between the control gate CG and the floating gate FG.

Further, it is necessary to make the capacitance accumulated between the control gate and the floating gate FG of the transistor Tr1 in a fixed value in order to decrease variation of the voltage VL. So that, the control gate CG is formed so as to cover both the floating gate and the inter-layer film SM as shown in FIG. 6B. The capacitance C1U does not receive adverse effect even when the control gate CG is mis-aligned to the floating gate FG.

On the other hand, the place where the electrons are attracted to the floating gate FG is vicinity of the drain D, because movement of the electrons is accelerated sufficiently at vicinity of the drain D. So that, the drain D should be located right beside the floating gate FG.

In order to satisfy the requirements stated in the above, the drain D is formed by carrying out ion implantation of arsenic with self-alignment method by utilizing both the floating gate and the inter-layer film SM as a mask after forming the floating gate and the inter-layer film SM made of the ONO layer as shown in FIG. 8A. Thereafter, the control gate CG is formed so as to cover both the floating gate FG and the inter-layer film SM (see FIG. 8B, FIG. 8C). Thus, the switching element SW is completed.

However, the method for manufacturing the switching element described in the above has following disadvantages. As shown in FIG. 8A, upper surface of the ONO layer composing the inter-layer film SM which consisting a part of the mask is damaged during the ion implantation of arsenic with self-alignment method by utilizing both the floating gate and the inter-layer film SM as the mask. The damages lead degradation of charge-storage characteristic of the ONO layer because thickness of the ONO layer is very thin. So that, there is high probability to cause short-circuit between the control gate and the floating gate FG of the transistor TR1.

SUMMARY OF THE INVENTION

It is an object of the present invention to provide a semiconductor device having a high charge-storage characteristic as well as resolving the problems occurred in the semiconductor device such as the switching element SW and the like stated in the above, and a method for manufacturing thereof.

In accordance with characteristics of the present invention, a semiconductor device comprises;

a first element having a lower conductive film made of conductive materials, an inter-layer film made of insulating materials and an upper conductive film made of conductive materials, the first element being formed by disposing in order of the lower conductive film, the inter-layer film and the upper conductive film, a second element having a lower conductive film made of conductive materials connected to the lower conductive film of the first element, an inter-layer film made of insulating materials, and an upper conductive film made of conductive materials and connected to the upper conductive film of the first element, the second element being formed by disposing in order of the lower conductive film, the inter-layer film and the upper conductive film, characterized in that thickness of the inter-layer film of the first element is thicker than the inter-layer film of the second element.

Also, in accordance with characteristics of the present invention, a method for manufacturing a semiconductor device having a first element and a second element comprises steps of;

step for preparing a semiconductor substrate having a first device formation region for forming the first element and a second device formation region for forming the second element, step for forming a lower conductive layer on the first device formation region and the second device formation region of the semiconductor substrate, step for forming a layer for forming a second inter-layer film on the lower conductive layer, step for removing the layer for forming the second inter-layer film on the first device formation region, step for forming a first lower conductive film by removing the lower conductive layer on the first device formation region partially, step for forming a first inter-layer film made of a insulating material so as to cover the first lower conductive film, step for implanting impurities to the first device formation region using the first lower conductive film and the first inter-layer film as a mask, step for forming an upper conductive layer on the first device formation region and the second device formation region, step for forming a first upper conductive film by removing the upper conductive layer on the first device formation region partially, and forming a second upper conductive film, a second inter-layer film and a second lower conductive film by removing the upper conductive layer, the layer for forming the second inter-layer film and the lower conductive layer on the second device separation region partially, characterized in that the first inter-layer film is formed thicker than the second inter-layer film, and thickness of the first inter-layer film is sufficient enough to trap impurities within the first inter-layer film when the impurities are implanted to the first device formation region.

While the novel features of the invention are set forth in a general fashion, both as to organization and content, it will be better understood and appreciated, along with other objections and features thereof, from the following detailed description taken in conjunction with the drawings.

BRIEF DESCRIPTION OF THE DRAWINGS

FIG. 3 is a plane view showing substantial structure of the switching element in an embodiment of the present invention.

FIG. 6A is a circuit diagram of the switching element in the earlier technology.

FIG. 6B is a cross-sectional view showing structure of a transistor for programming in earlier technology.

FIG. 6C is a cross-sectional view showing structure of a transistor for switching in earlier technology.

DETAILED DESCRIPTION OF THE PREFERRED EMBODIMENT

A part of manufacturing processes of a switching element SW a s a manufacturing method of a semiconductor device in an embodiment of the present invention is shown in FIG. 1A, FIG. 1B, FIG. 1C, FIG. 2A and FIG. 2B. FIG. 3 is a plane view showing substantial structure of the switching element in an embodiment of the present invention. The structure of the switching element SW is equal to the circuit shown in FIG. 6A. In other words, the switching element SW is a switching element using both of a transistor TR1 for programming and a transistor TR2 for switching, and the switching element SW is used as a switch for a field programmable gate array (hereinafter referred to as FPGA) which is a kind of the PLD.

Figure 1A:
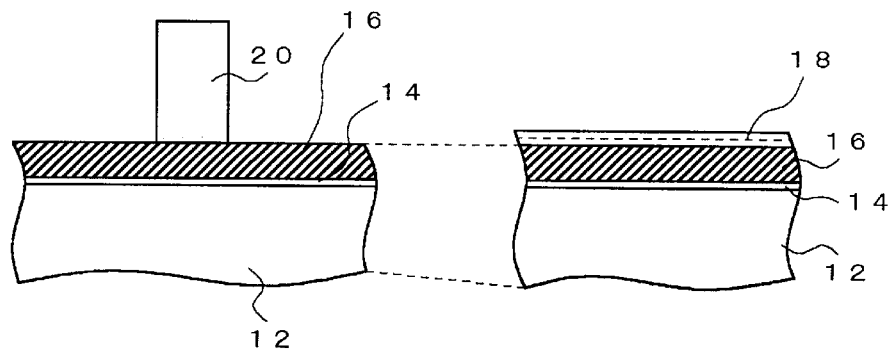
FIG. 1A is a view showing a part of manufacturing processes of a switching element as a manufacturing method of a semiconductor device in an embodiment of the present invention.

In order for manufacturing the switching element SW, a semiconductor-substrate 12 on which an oxidation layer 14, a polysilicon layer 16 and an ONO layer 18 are formed is prepared as shown in FIG. 1A. Thereafter, only the ONO layer 18 located vicinity of the transistor TR1 for programming is removed by carrying out etching using a photo-resist film (not shown) as a mask. A photo-resist film 20 is formed on the polysilicon layer 16 which is exposed by the etching.

Figure 1B:
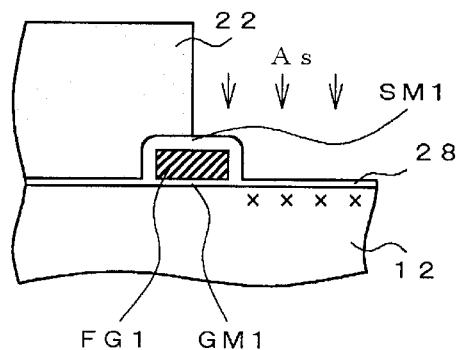
FIG. 1B is a view showing a part of manufacturing processes of a switching element as a manufacturing method of a semiconductor device in an embodiment of the present invention.

Next, both of a floating gate FG1 as lower conductive film of the first element (first lower conductive film) and a gate oxidation film GM1 are formed by carrying out etching of the polysilicon layer 16 and the oxidation layer 14 using the photo-resist film 20 as a mask as shown in Fig. 1B. Then, an oxidation layer 28 is formed by carrying out oxidation of the upper surface. The oxidation layer 28 located on the polysilicon layer is formed thicker than other parts. In this embodiment, the oxidation layer 28 located on the polysilicon layer is an inter-layer film SM1 as inter-layer film of the first element (first inter-layer film). So that, the inter-layer film SM1 is formed so as to cover the floating gate FG1. Further to above, arsenic is implanted ionically into the semiconductor-substrate 12 using a photo-resist film 22, the floating gate FG1 and the inter-layer film SM1 as a mask after carrying out patterning of the photo-resist film 22.

Ions of the arsenic thus implanted do not pass through the inter-layer film SM1 and are stopped at the surface of the inter-layer film SM1. Because the inter- layer film SM1 is made of a silicon oxidation layer formed relatively thick. Consequently, the inter-layer film SM1 maintains its charge-storage characteristic originally owns even when ion implantation of arsenic is carried out.

Figure 1C:
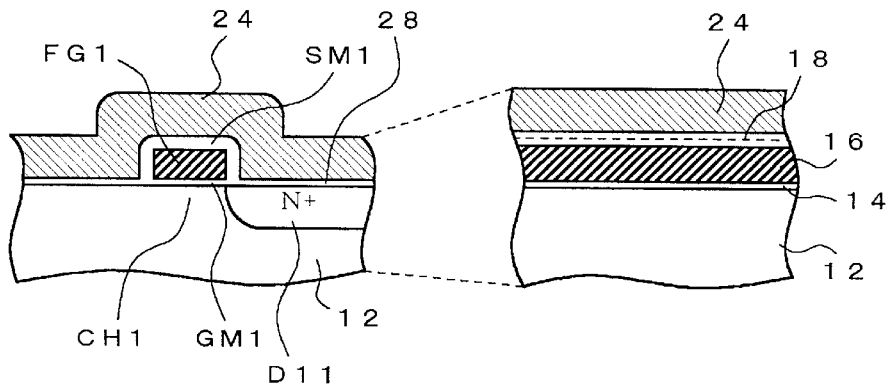
FIG. 1C is a view showing a part of manufacturing processes of a switching element as a manufacturing method of a semiconductor device in an embodiment of the present invention.

Thereafter, a polysilicon layer 24 is formed on entirely by carrying out chemical vapor deposition (hereinafter referred to as CVD) method or other methods after removing the photo-resist film 22 as shown in FIG. 1C. The ions implanted into the semiconductor-substrate 12 is diffused during the formation process of the polysilicon layer 24. As a result of the diffusion, a first drain D11 as impurity implantation region is formed. The region located right beside the first drain D11 and right under the floating gate FG1 through the gate oxidation layer GM1 becomes a channel region CH1 as non impurity implantation region.

Figure 2A:
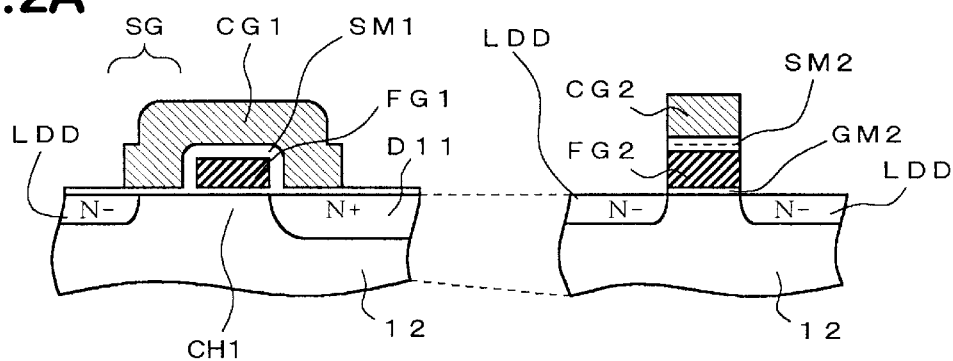
FIG. 2A is a view showing a part of manufacturing processes of the switching element in an embodiment of the present invention.

Upon forming the first drain D11, a control gate CG1 as upper conductive film of the first element (first upper conductive film) is formed by carrying out etching of the polysilicon layer 24 using a photo-resist film (not shown) as a mask as shown in FIG. 2A. The control gate CG1 is formed so as to cover the inter-layer film SM1. A split gate SG is composed of a part of the control gate CG1.

Besides, a control gate CG2 as upper conductive film of the second element (second upper conductive film) is formed by carrying out etching of the polysilicon layer 24 as done in previous process at the part where the transistor TR2 to be formed. An inter-layer film SM2 as inter-layer film of the second element (second inter-layer film), a floating gate FG2 as lower conductive film of the second element (second lower conductive film) and a gate oxidation film GM2 are formed by carrying out additional etching utilizing the mask used in the previous process.

Next, a lightly doped drain-source (LDD) is formed by carrying out ion implantation of negative type low density impurities to the semiconductor-substrate 12 using both of the control gate CG1 and the control gate CG2 as a mask.

Figure 2B:
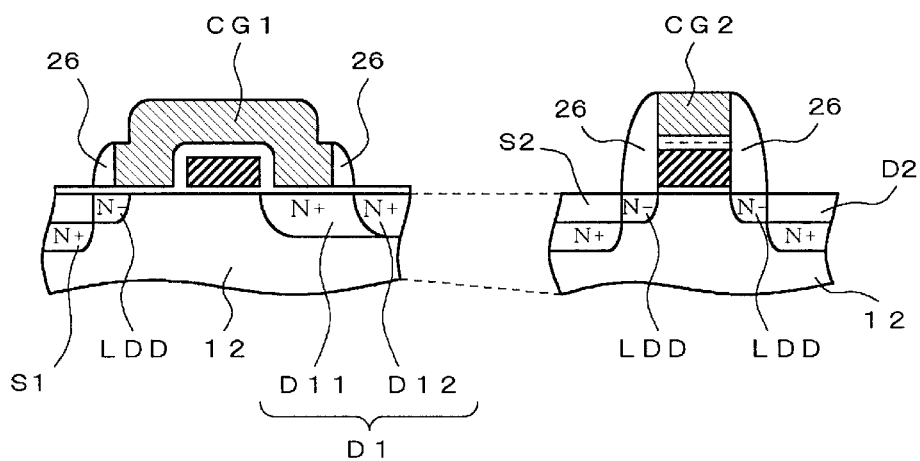
FIG. 2B is a view showing a part of manufacturing processes of the switching element in an embodiment of the present invention.

Thereafter, side walls 26 are formed by carrying out anisotropic etching after covering the surface with a silicon oxidation layer (not shown) by carrying out CVD method or other methods as shown in FIG. 2B. A source S1 and a second drain D12 of the transistor TR1, a source S2 and a drain D2 of the transistor TR2 are formed by carrying out ion implantation of negative type high density impurities to the semiconductor-substrate 12 using the control gate CG1, the control gate CG2 and the side walls 26 as a mask. As shown in FIG. 2B, a drain D1 is composed of the first drain D11 and the second drain D12 of the transistor TR1.

The inter-layer film SM2 (see FIG. 2A) sandwiched between the control gate CG2 and the floating gate FG2 of the transistor TR2 is formed so as to have much larger area than the inter-layer film SM1 (see FIG. 2A) sandwiched between the control gate CG1 and the floating gate FG1 of the transistor TR1 in the switching element SW thus completed as shown in FIG. 3.

Therefore, not much influence is expected even when the thickness of the inter-layer film SM1 of the transistor TR1 occupied relatively much smaller area is made thicker.

A part of manufacturing processes of the switching element SW in another embodiment of the present invention is shown in FIG. 4A, FIG. 4B, FIG. 4C, FIG. 5A to FIG. 5C. Cross-sectional views of section P1—P1 of the transistor TR1 shown in FIG. 3 are illustrated in FIG. 4A to FIG. 5C. The structure of section P2—P2 of the transistor TR2 shown in FIG. 3 is the same as the previous embodiment shown in FIG. 1A to FIG. 2B.

The manufacturing method of the switching element SW in this embodiment is almost the same as the manufacturing method of the switching element SW shown in FIG. 1A to FIG. 2B. Each of the process shown in FIG. 1A, FIG. 1B, FIG. 1C, FIG. 2A and FIG. 2B corresponds with the process of the embodiment shown in FIG. 4A, FIG. 4B, FIG. 5A, FIG. 5B and FIG. 5C respectively. That is, in the embodiment described herein, another process shown in FIG. 4C is inserted between the processes of the previous embodiment shown in FIG. 1B and FIG. 1C.

Figure 4A:
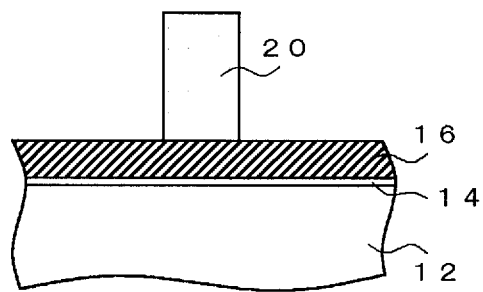
FIG. 4A is a view showing a part of manufacturing processes of a switching element as a manufacturing method of a semiconductor device in another embodiment of the present invention.
Figure 4B:
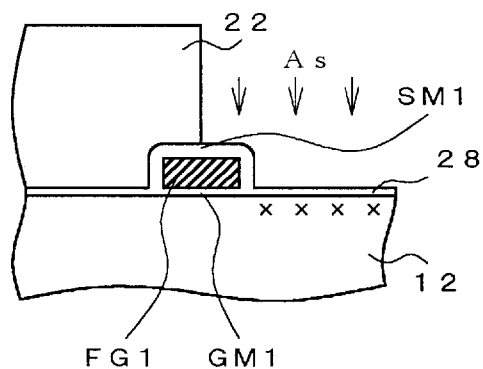
FIG. 4B is a view showing a part of manufacturing processes of a switching element as a manufacturing method of a semiconductor device in another embodiment of the present invention.
Figure 4C:
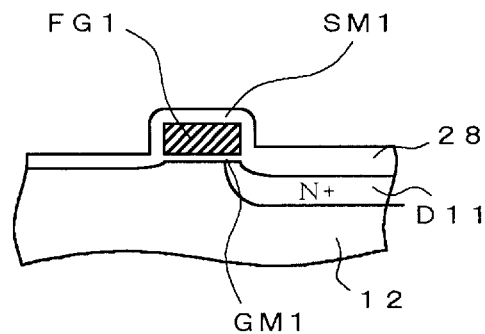
FIG. 4C is a view showing a part of manufacturing processes of a switching element as a manufacturing method of a semiconductor device in another embodiment of the present invention.
Figure 5A:
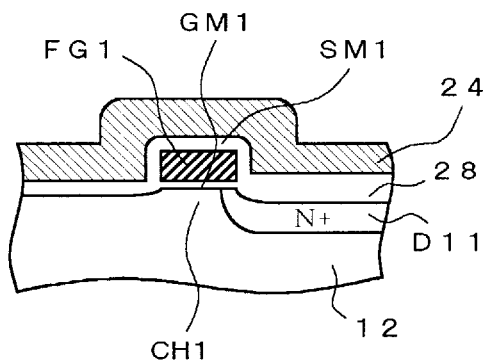
FIG. 5A is a cross-sectional view showing a part of manufacturing processes of a switching element in another embodiment of the present invention.
Figure 5B:
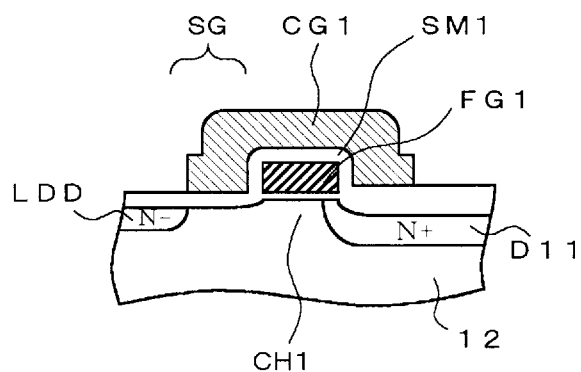
FIG. 5B is a cross-sectional view showing a part of manufacturing processes of a switching element in another embodiment of the present invention.
Figure 5C:
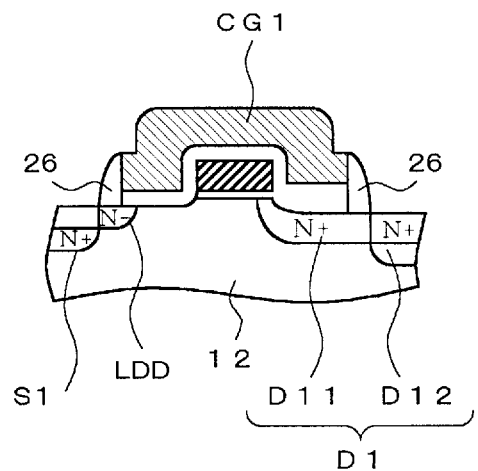
FIG. 5C is a cross-sectional view showing a part of manufacturing processes of a switching element in another embodiment of the present invention.
Figure 7:
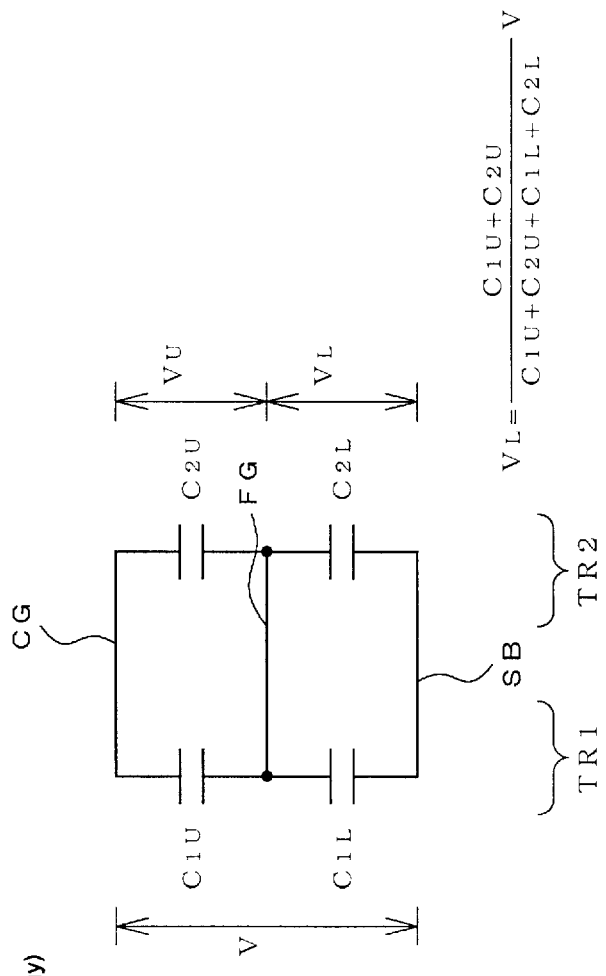
FIG. 7 are views showing an equivalent circuit of the switching element assuming the element as connection of a plurality of capacitor, and an equation for calculating a divided voltage applied to the capacitors.
Figure 8A:
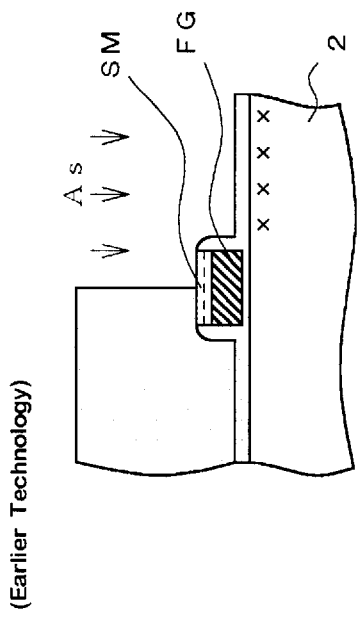
FIG. 8A is a view showing a part of manufacturing processes of the switching element in the earlier technology.
Figure 8B:
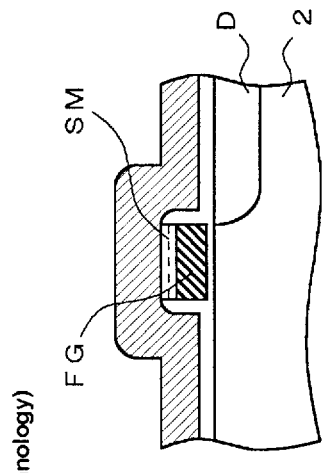
FIG. 8B is a view showing a part of manufacturing processes of the switching element in the earlier technology.
Figure 8C:
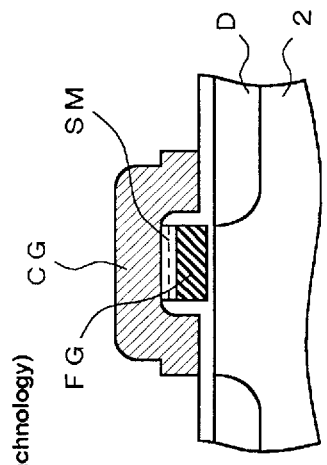
FIG. 8C is a view showing a part of manufacturing processes of the switching element in the earlier technology.

In other words, ion implantation of arsenic is carried out to the semiconductor-substrate 12 using a photo-resist film 22, the floating gate FG1 and the inter-layer film SM1 as a mask after carrying out patterning of the photo-resist film 22 as shown in FIG. 4B. Then, the upper surface is oxidized as shown in FIG. 4C. Quality of the inter-layer film SM1 damaged during the ion implantation of arsenic is recovered to the original quality due to the heat applied in the oxidation process. So that, charge-storage characteristic of the inter-layer film SM1 is improved further.

The first drain D11 as the impurity implantation region is formed since the arsenic ions implanted to the semiconductor-substrate 12 are diffused during the oxidation process. Although the oxidation layer 28 grows with certain rate, the oxidation layer 28 located on the first drain D11 having higher impurity density grows much faster than other parts.

The present invention is applied to the switching element SW used as switch of the FPGA which is a kind of the PLD in the embodiments described in the above. Application of the present invention is not limited to the switching element SW described in the above. The present invention can also be applied to the switching element used for a programmable logic array (PLA) as another kind of the PLD, another switching element for other devices except for the PLD, and semiconductor devices for general purpose (which is used not only for switching).

In the embodiment described in the above, the silicon oxidation layer is used as the inter-layer film of the first element, and the ONO layer is used as the inter-layer film of the second element. Both of the inter-layer film of the first element and the inter-layer film of the second element can be formed other kind of materials. Also, both the inter-layer film of the first element and the inter-layer film of the second element can be formed by the same material in different thickness.

Although, the inter-layer film of the second element has much larger area than the inter-layer film of the first element, it is not necessary to form the inter-layer film of the second element so as to have larger area than the inter-layer film of the first element.

In the embodiment described in the above, the first element is formed by arranging the lower conductive layer located on a non impurity implantation region which is located beside the impurity implantation region formed within the semiconductor-substrate, and by arranging the inter-layer film and the upper conductive film in order of the inter-layer film and the upper conductive film so as to cover the lower conductive film. The present invention can also be applied to a semiconductor device comprising the first element consist of the lower conductive film, the inter-layer film and the upper conductive film formed by depositing the films simply in that order.

The present invention is characterized in that, the lower conductive film of the first element and the lower conductive film of the second element, and the upper conductive film of the first element and the upper conductive film of the second element are connected with each other respectively. Also, thickness of the inter-layer film of the first element is formed thicker than the inter-layer film of the second element.

So that, though thickness of the inter-layer film of the first element is formed thickly, the capacitance accumulated between the upper conductive film and the lower conductive film is not decreased largely as a result of influence of the second element having thinner inter-layer film. Thus, the inter-layer film of the first element can be formed in a certain thickness with maintaining the capacitance in a certain amount.

Consequently, probability of damaging to a lower part of the inter-layer film of the first element is low even when ion implantation of the impurities are carried out using the inter-layer film of the first element as a mask. In other words, it is possible to prevent degradation of the charge-storage characteristic between the upper conductive film and the lower conductive film with maintaining the capacitance accumulated between upper conductive film and the lower conductive film in a certain amount.

Also, the present invention is characterized in that, area of the inter-layer film of the second element is formed larger than the inter-layer film of the first element.

So that, less influence is expected even when the inter-layer film of the first element occupied relatively much smaller area is formed thicker than the inter-layer film of the second element. In other words, it is possible to prevent degradation of the charge-storage characteristic between the upper conductive film and the lower conductive film with maintaining the capacitance accumulated between upper conductive film and the lower conductive film in a high amount.

Further, the present invention is characterized in that, the first element is formed by arranging the lower conductive film located on a non impurity implantation region which is located beside the impurity implantation region formed within the semiconductor-substrate, and by arranging the inter-layer film and the upper conductive film in order of the inter-layer film and the upper conductive film so as to cover the lower conductive layer, and thickness of the inter-layer film being sufficient enough to trap impurities within the inter-layer film.

Therefore, the impurities do not pass through the inter-layer film even when the impurity implantation region must be formed by carrying out implantation with self-alignment method using the inter-layer film and the lower conductive film as a mask. That is, it is possible to realize a semiconductor device having a higher charge-storage characteristic.

Further, the present invention is characterized in that, the inter-layer film of the first element is made of a silicon oxidation layer, and the inter-layer film of the second element is composed of a layer having triple layered structure of the a silicon oxide layer—a silicon nitride layer—a silicon oxide layer (ONO layer).

Therefore, a sufficient value of capacitance can be maintained by the ONO layer formed thinly, and degree of damages occurred during impurity implantation is decreased by the silicon oxidation film formed thickly. In other words, it is possible to maintain certain charge-storage characteristic as well as further suppressing reduction of the capacitance.

Still further, the present invention is characterized in that, oxidation is carried out after carrying out impurity implantation to the first device formation region.

Therefore, quality of the damaged inter-layer film of the first element used as the mask during the implantation is recovered to the original quality in the oxidation process. In other words, charge-storage characteristic of the inter-layer film is improved further.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor device comprising:
    a first element having a substrate, an insulation layer, a lower conductive film made of conductive materials, an inter-layer film made of insulating materials and an upper conductive film made of conductive materials, the first element being formed by disposing in order of the insulation layer, the lower conductive film, the inter-layer film and the upper conductive film on the substrate;
    a second element having a substrate connected to the substrate being used for the first element, an insulation layer, a lower conductive film made of conductive materials connected to the lower conductive film of the first element, an inter-layer film made of insulating materials, and an upper conductive film made of conductive materials and connected to the upper conductive film of the first element, the second element being formed by disposing in order of the insulation layer, the lower conductive film, the inter-layer film and the upper conductive film on the substrate; and
    wherein thickness of the semiconductor device includes a composite capacitor having a desired capacitance, the composite capacitor connecting a first capacitor and a second capacitor in parallel manner while forming the inter-layer film of the first element thicker than the inter-layer film of the second element, the first capacitor being composed of the lower conductive layer, the inter-layer film and the upper conductive layer of the first element, and the second capacitor being composed of the lower conductive layer, the inter-layer film and the upper conductive layer of the second element.

2. A semiconductor device in accordance with claim 1, wherein area of the inter-layer film of the second element is larger than the inter-layer film of the first element.

3. A semiconductor device in accordance with claim 2, wherein the first element is formed by arranging the lower conductive film located on a non impurity implantation region which is located beside an impurity implantation region formed within a semiconductor-substrate, and by arranging the inter-layer film and the upper conductive film in order of the inter-layer film and the upper conductive film so as to cover the lower conductive film, and wherein the inter-layer film of the first element is formed in a thickness having sufficient enough to trap impurities within the inter-layer film of the first element when the impurities are implanted to the impurity implantation region.

4. A semiconductor device in accordance with claim 3, wherein the inter-layer film of the first element is made of a silicon oxidation layer, and wherein the inter-layer film of the second element is composed of a layer having triple layered structure of a silicon oxide layer, a silicon nitride layer and a silicon oxide layer (ONO layer).

5. A semiconductor device in accordance with claim 1, wherein the first element is formed by arranging the lower conductive film located on a non impurity implantation region which is located beside an impurity implantation region formed within a semiconductor-substrate, and by arranging the inter-layer film and the upper conductive film in order of the inter-layer film and the upper conductive film so as to cover the lower conductive film, and wherein the inter-layer film of the first element is formed in a thickness having sufficient enough to trap impurities within the inter-layer film of the first element when the impurities are implanted to the impurity implantation region.

6. A semiconductor device in accordance with claim 5, wherein the inter-layer film of the first element is made of a silicon oxidation layer, and wherein the inter-layer film of the second element is composed of a layer having triple layered structure of a silicon oxide layer, a silicon nitride layer and a silicon oxide layer (ONO layer).

7. A semiconductor device in accordance with claim 1, wherein the inter-layer film of the first element is made of a silicon oxidation layer, and wherein the inter-layer film of the second element is composed of a layer having triple layered structure of a silicon oxide layer, a silicon nitride layer and a silicon oxide layer (ONO layer).

8. A semiconductor device in accordance with claim 1, wherein both of the inter-layer film of the first element and the inter-layer film of the second element are formed in the same materials.

9. A semiconductor device in accordance with claim 1, wherein both of the lower conductive film of the first element and the lower conductive film of the second element are formed by polysilicon.

10. A semiconductor device in accordance with claim 1, wherein both of the upper conductive film of the first element and the upper conductive film of the second element are formed by polysilicon.

11. A semiconductor device in accordance with claim 1, wherein the semiconductor device is an element for switching, and wherein the first element is a transistor for programming, and wherein the second element is a transistor for switching.

12. A semiconductor device in accordance with claim 11, wherein at least one of the transistor for programming and the transistor for switching has a structure of lightly doped drain-source (LDD).

13. A semiconductor device in accordance with claim 11, wherein the transistor for programming has a structure of split-gate.

14. A semiconductor device in accordance with claim 11, wherein the element for switching is used for a switch of a programmable logic device (PLD).

* * * * *